United States Patent
Jang et al.

(10) Patent No.: US 9,087,998 B2
(45) Date of Patent: *Jul. 21, 2015

(54) FLEXIBLE DISPLAY PANEL HAVING ALTERNATELY STACKED METAL AND DIELECTRIC LAYERS

(71) Applicant: Samsung Display Co., Ltd., Yongin (KR)

(72) Inventors: Cheol Jang, Yongin (KR); Seung-Yong Song, Yongin (KR); Sang-Hwan Cho, Yongin (KR); Seung-Hun Kim, Yongin (KR); Chung-Sock Choi, Yongin (KR); Hyun-Ho Kim, Yongin (KR); Soo-Youn Kim, Yongin (KR); Sang-Hyun Park, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/062,313

(22) Filed: Oct. 24, 2013

(65) Prior Publication Data

US 2014/0374704 A1 Dec. 25, 2014

(30) Foreign Application Priority Data

Jun. 25, 2013 (KR) .................. 10-2013-0073315

(51) Int. Cl.
*H01L 51/00* (2006.01)
*H01L 51/56* (2006.01)
*H01L 51/52* (2006.01)
*H01L 27/32* (2006.01)

(52) U.S. Cl.
CPC .......... *H01L 51/0097* (2013.01); *H01L 27/323* (2013.01); *H01L 27/3244* (2013.01); *H01L 51/5262* (2013.01); *H01L 51/56* (2013.01)

(58) Field of Classification Search
CPC ... H01L 27/323; H01L 27/3244; H01L 51/56; H01L 51/0097; H01L 51/5262
USPC ................ 257/40, 59, 72, E51.018, E51.022
See application file for complete search history.

(56) References Cited

U.S. PATENT DOCUMENTS

| | | | |
|---|---|---|---|
| 6,411,019 B1 | 6/2002 | Hofstra et al. | |
| 6,876,018 B2 | 4/2005 | Ko | |
| 7,800,113 B2* | 9/2010 | Shoji et al. | 257/72 |
| 8,164,726 B2* | 4/2012 | Egi et al. | 349/137 |
| 8,168,523 B2* | 5/2012 | Ohnuma et al. | 438/592 |
| 8,368,071 B2* | 2/2013 | Ishikawa | 257/59 |
| 8,654,272 B2* | 2/2014 | Yamazaki et al. | 349/43 |
| 8,729,550 B2* | 5/2014 | Yamazaki et al. | 257/59 |
| 8,822,990 B2* | 9/2014 | Yamazaki et al. | 257/43 |
| 2004/0141130 A1* | 7/2004 | Kawata et al. | 349/139 |

(Continued)

FOREIGN PATENT DOCUMENTS

| | | |
|---|---|---|
| KR | 10-2010-0074748 | 7/2010 |
| KR | 10-2012-0004943 | 1/2012 |
| WO | 2005-099311 | 10/2005 |

*Primary Examiner* — Ida M Soward
(74) *Attorney, Agent, or Firm* — H.C. Park & Associates, PLC

(57) ABSTRACT

A flexible display panel and a method of manufacturing the same. The flexible display panel includes: a flexible panel including a display region and a non-display region, wherein the display region includes an organic light emitting device; a planarization layer disposed on the flexible panel; and a metal-dielectric layer disposed on the planarization layer and including a metal layer and a dielectric layer.

15 Claims, 5 Drawing Sheets

(56) References Cited

U.S. PATENT DOCUMENTS

| | | | |
|---|---|---|---|
| 2004/0218133 A1* | 11/2004 | Park et al. | 349/153 |
| 2005/0064685 A1* | 3/2005 | Hayakawa | 438/517 |
| 2006/0176423 A1* | 8/2006 | Lee | 349/96 |
| 2006/0209246 A1* | 9/2006 | Kim | 349/155 |
| 2007/0004102 A1* | 1/2007 | Dairiki et al. | 438/149 |
| 2007/0058102 A1* | 3/2007 | Shimizu et al. | 349/44 |
| 2007/0222923 A1* | 9/2007 | Wang et al. | 349/110 |
| 2007/0262705 A1 | 11/2007 | Fukuda et al. | |
| 2009/0278449 A1* | 11/2009 | Choi et al. | 313/504 |
| 2010/0038639 A1* | 2/2010 | Akimoto | 257/43 |
| 2010/0059747 A1* | 3/2010 | Nakayama et al. | 257/43 |
| 2011/0031493 A1* | 2/2011 | Yamazaki et al. | 257/43 |
| 2011/0052836 A1* | 3/2011 | Kim et al. | 428/1.1 |
| 2011/0088770 A1* | 4/2011 | Allemand et al. | 136/256 |
| 2011/0109591 A1* | 5/2011 | Kurokawa et al. | 345/175 |
| 2011/0169810 A1* | 7/2011 | Kimura | 345/211 |
| 2012/0217516 A1* | 8/2012 | Hatano et al. | 257/88 |
| 2013/0264595 A1* | 10/2013 | Hong et al. | 257/91 |
| 2014/0117330 A1* | 5/2014 | Cho et al. | 257/40 |

* cited by examiner

FLEXIBLE DISPLAY PANEL HAVING ALTERNATELY STACKED METAL AND DIELECTRIC LAYERS

CROSS-REFERENCE TO RELATED PATENT APPLICATION

This application claims priority from and the benefit of Korean Patent Application No. 10-2013-0073315, filed on Jun. 25, 2013, which is hereby incorporated by reference for all purposes as if fully set forth herein.

BACKGROUND

1. Field

Exemplary embodiments of the present invention relate to a flexible display panel and a method of manufacturing the same.

2. Discussion of the Background

Display apparatuses display an image according to an image signal. Examples of display apparatuses include televisions, computer monitors, personal digital assistants (PDAs), and smart devices which are tremendously increasing in demand.

Recently, display apparatuses are increasingly being replaced by flat panel display apparatuses that are thin and portable. Flat panel organic or inorganic light emitting display apparatuses that are self-emissive have wide viewing angles, excellent contrast, and quick response speeds, and thus are receiving attentions as next generation display apparatuses. Also, the organic light emitting display apparatuses whose emission layer is formed of an organic material have excellent luminance, driving voltages, and response speeds, as compared to inorganic light emitting display apparatuses, and are capable of realizing a color image. Recently, flexible display apparatuses that include a flexible member to the organic light emitting display apparatuses are being studied.

One of the packaging technologies for protecting light emitting devices of such flexible display apparatuses is thin film encapsulation. According to thin film encapsulation technology, a display region of a substrate is encapsulated by a thin film encapsulation layer by alternatively stacking an inorganic film and an organic film at least on light emitting devices.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention provide a flexible display panel having improved bending characteristics that are obtained by decreasing a thickness of the entire display panel.

Exemplary embodiments of the present invention also provide a flexible display panel having an improved visibility.

Additional features of the invention will be set forth in the description which follows, and in part will become apparent from the description, or may be learned from practice of the invention.

An exemplary embodiment of the present invention discloses a flexible display panel including: a flexible panel including a display region and a non-display region, wherein the display region includes an organic light emitting device; a planarization layer disposed on the flexible panel; and a metal-dielectric layer disposed on the planarization layer, the metal-dielectric layer including a metal layer and a dielectric layer.

An exemplary embodiment of the present invention also discloses a method of manufacturing a flexible display panel, the method including: forming a thin film transistor comprising an active layer, a gate electrode, a source electrode and a drain electrode, on a substrate; forming an organic light emitting device including a first electrode, a second electrode facing the first electrode, and an organic emission layer formed between the first and second electrodes according to an opening of a pixel defining layer; and forming, on the organic light emitting device, an anti-reflection layer including a planarization layer, metal layer, and a dielectric layer.

An exemplary embodiment of the present invention also discloses a flexible display panel including: a flexible panel comprising an organic light emitting device disposed on a substrate; and a polarizable anti-reflection layer formed on the flexible panel, wherein the anti-reflection layer is formed by alternately stacking a metal layer and a dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
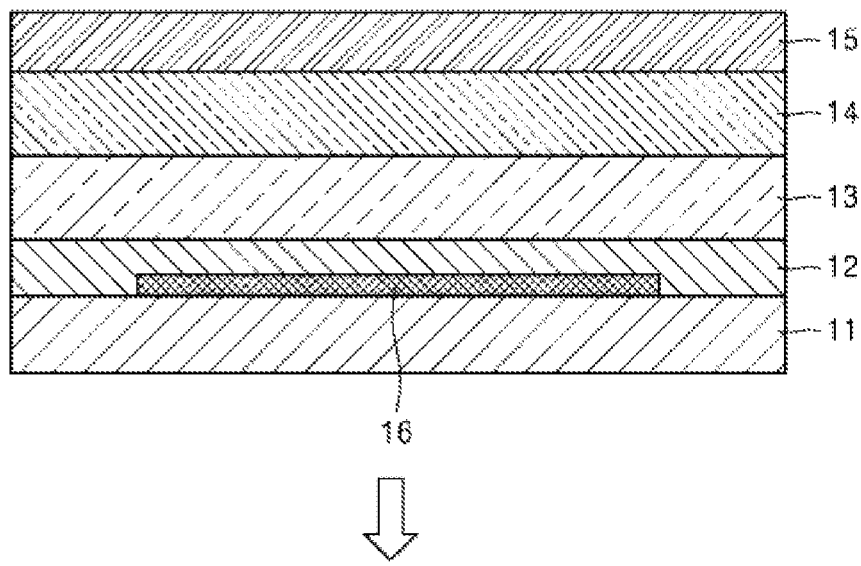
FIG. 1 is a diagram schematically illustrating a cross-section of a conventional flexible display panel in bent and unbent states.
Figure 1:
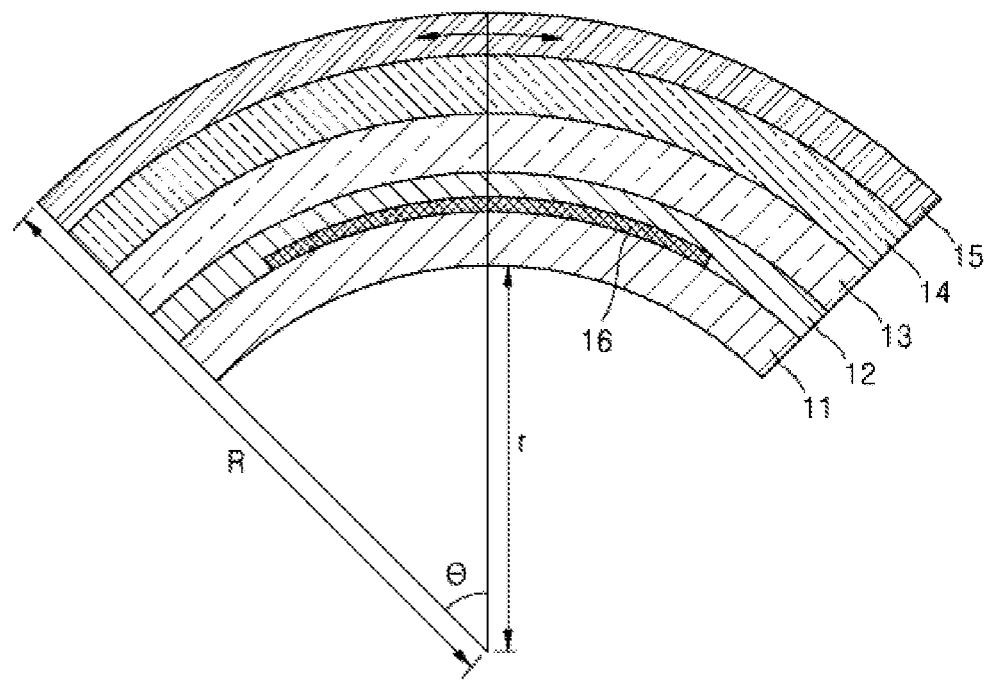

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of elements may be exaggerated for clarity. Like reference numerals in the drawings denote like elements.

It is to be understood that the various exemplary embodiments of the invention, although different, are not necessarily mutually exclusive. For example, a particular feature, structure, or characteristic described herein, in connection with one exemplary embodiment, may be implemented within other exemplary embodiments without departing from the spirit and scope of the invention. In addition, it is to be understood that a location or arrangement of individual elements within each disclosed exemplary embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled.

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

As used herein, the term "and/or" includes any and all combinations of one or more of the associated listed items.

FIG. 1 is diagrams schematically illustrating a cross-section of a conventional flexible display panel in bent and unbent states.

Referring to FIG. 1, the conventional flexible display panel includes an organic emission layer 16, a thin film encapsulation layer 12, a polarizer 13, a touch screen panel 14, and a window layer 15 on a flexible substrate 11. Each layer in the conventional flexible display panel may be formed of a flexible material.

The organic emission layer 16 may include a plurality of thin film transistors and a plurality of light emitting devices. The thin film encapsulation layer 12 is disposed on the organic emission layer 16 to encapsulate the organic emission layer 16. The thin film encapsulation layer 12 may have a stacked structure in which an organic film and an inorganic film are repeatedly stacked on each other, and may prevent external moisture from penetrating into the organic emission layer 16. A display apparatus may be made thinner by using the thin film encapsulation layer 12 to protect the organic emission layer 16, instead of a general encapsulation substrate.

The polarizer 13 is disposed on the thin film encapsulation layer 12. The polarizer 13 may prevent scattering or interference and improve a color sense by improving linearity of light emitted from the organic emission layer 16. Also, the polarizer 13 selects and transmits external light, and prevents reflection of external light to improve image visibility of the display apparatus.

The touch screen panel 14 and the window layer 15 are disposed on the thin film encapsulation layer 12. The touch screen panel 14 detects a touch of a user and converts the touch to an electric signal, and the window layer 15 operates as an outermost barrier for the conventional flexible display panel to directly contact an external environment.

In summary, the conventional flexible display panel of FIG. 1 includes the thin film encapsulation layer 12 for protecting the organic emission layer 16, as well as the organic emission layer 16 emitting a light required to display an image. Films, such as the polarizer 13, the touch screen panel 14, and the window layer 15 are attached to the thin film encapsulation layer 12. Here, a thickness of the film (the polarizer 13, the touch screen panel 14, and the window layer 15) accounts for most of the thickness of the general flexible display panel. In particular, since the polarizer 13 includes a hard, thick polycarbonate (PC) film, the polarizer 13 is not suitable for a flexible display panel.

The lower portion of FIG. 1 shows layers that are transformed when the conventional flexible display panel is bent. As described above, the thickness of the film (the polarizer 13, the touch screen panel 14, and the window layer 15) accounts for most of the thickness of the general flexible display panel and, thus, the thickness of the film is a factor that determines how much the conventional flexible display panel may bend. In other words, when a bendable center angle is $\theta$ and the conventional flexible display panel is bent according to thicknesses, a tension applied to the window layer 15 at the top of the general flexible display panel is proportional to $R\theta$. A tension applied to the flexible substrate 11 at the bottom of the general flexible display panel is proportional to $r\theta$. Thus, a difference between the tensions increases as (R-r) is increased, thereby reducing the durability of the conventional flexible display panel. Also, when r is a fixed value, the bendable center angle $\theta$ is increased when R is decreased. Accordingly, there is a need to reduce a thickness of a flexible display panel.

Figure 2:
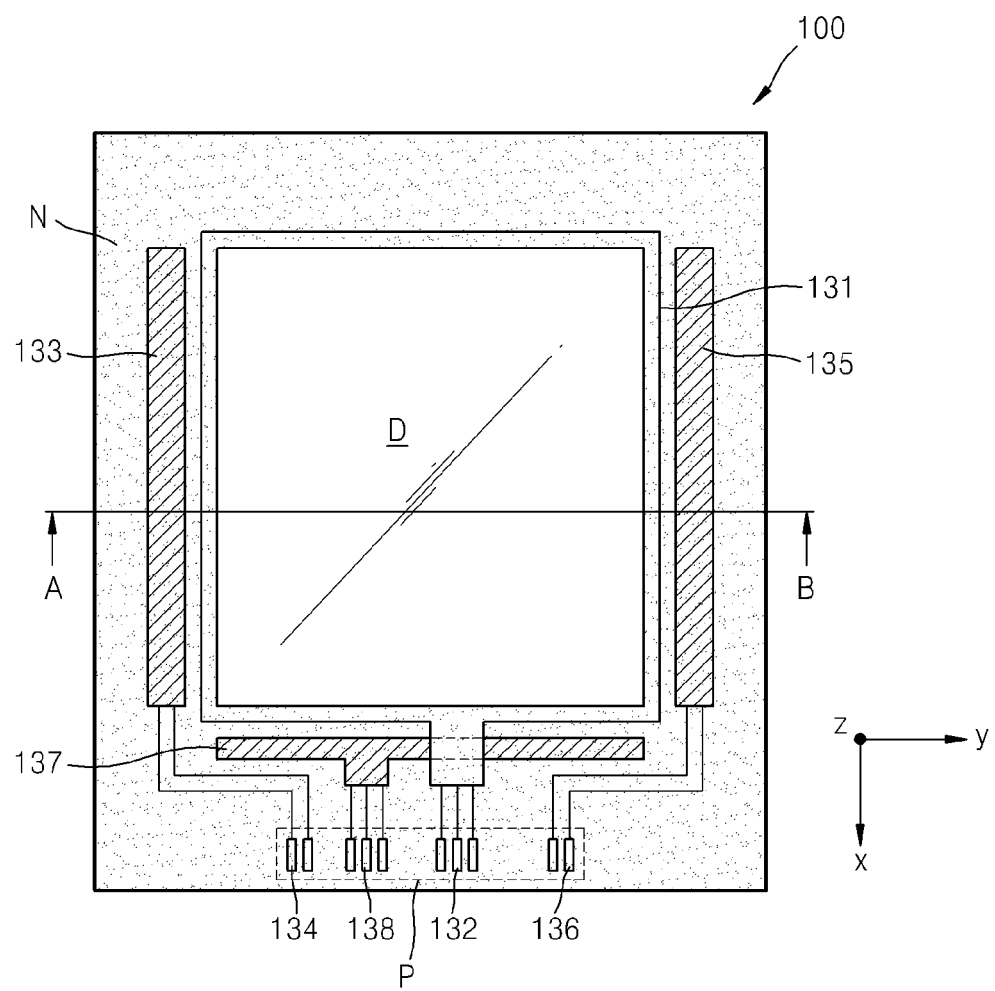
FIG. 2 is a plan view schematically illustrating a flexible display panel according to an exemplary embodiment of the present invention.

FIG. 2 is a plan view schematically illustrating a flexible display panel 100 according to an exemplary embodiment of the present invention.

Referring to FIG. 2, the flexible display panel 100 includes a display region D and a non-display region N disposed outside the display region D. An image signal is displayed in the display region D, which may include any one of various display devices, such as an organic light emitting device, a liquid crystal display device, and an electrophoresis device. The display region D will be described in detail later. Also, the flexible display panel 100 may be either an active matrix (AM) type or a passive matrix (PM) type.

The non-display region N may include various circuits (not shown) and wirings (not shown) so as to supply an image signal to a display device disposed in the display region D.

Referring to FIG. 2, an electrode power supply line 131 for supplying power to a second electrode 123 (to be described later), and a terminal unit 132 of the electrode power supply line 131 are disposed in the non-display region N. A scanning circuit 133 for transferring a driving signal to the display region D, and a terminal unit 134 of the scanning circuit 133, are disposed in the non-display region N. A data circuit unit 135 for transferring a data signal to the display region D, and a terminal unit 136 of the data circuit unit 135 are also disposed in the non-display region N. In addition, a driving power wire unit 137 for supplying driving power to the display region D, and a terminal unit 138 of the driving power wire unit 137 are disposed in the non-display region N. A pad unit P, in which the terminal units 132, 134, 136, and 138 are disposed, is disposed in the non-display region N.

The various circuits, wires, and terminal units shown in FIG. 2 are only examples for forming the non-display region N, and other arrangements of parts may also be utilized.

Figure 3:
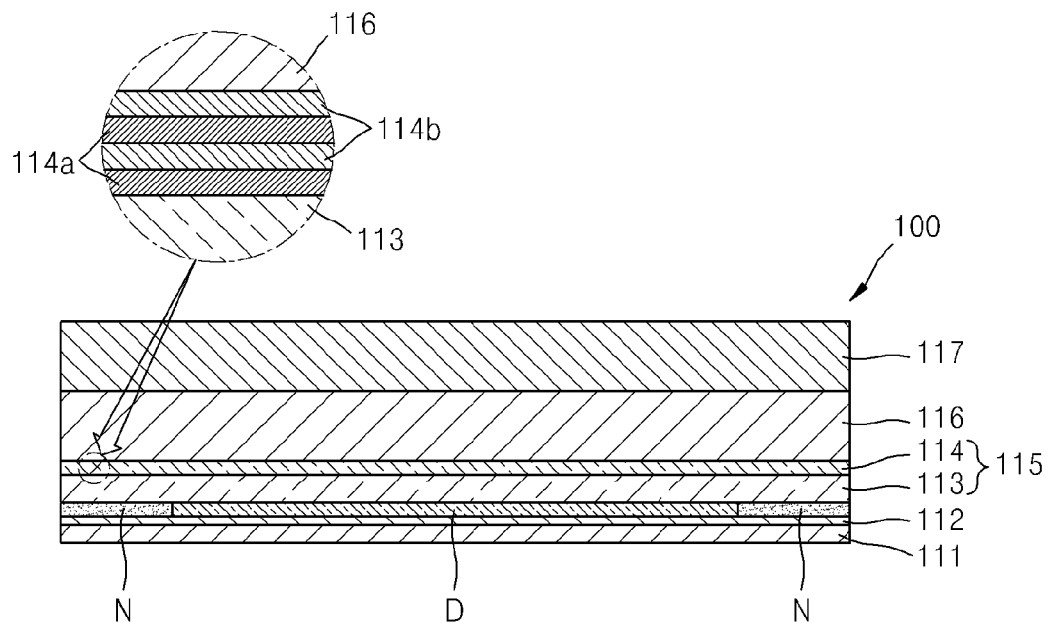
FIG. 3 is a diagram schematically illustrating a cross-section of the flexible display panel of FIG. 2.

FIG. 3 is a diagram schematically illustrating a cross-sectional view taken along a line A-B of FIG. 2, and components that are not directly related to an exemplary embodiment of the present invention may be briefly illustrated or omitted.

The flexible display panel 100 includes a flexible substrate 111, a barrier film 112 disposed on the flexible substrate 111, the display region D and the non-display region N disposed on the barrier film 112, an anti-reflection layer 115 including a planarization layer 113 and a metal-dielectric layer 114, a touch screen panel 116, and a window layer 117.

The flexible substrate 111 may be formed of plastic having excellent thermal resistance and durability, such as polyethylene etherphthalate, polyethylene naphthalate, polycarbonate, polyarylate, polyetherimide, polyethersulfone, and polyimide. However, the material of the flexible substrate 111 is not limited thereto and may be any suitable flexible material.

The barrier film 112 may be disposed on the flexible substrate 111. The barrier film 112 may be formed of at least one of an inorganic film and an organic film. The barrier film 112 prevents undesirable contaminants from penetrating into the display region D through the flexible substrate 111.

The display region D and the non-display region N disposed outside the display region D may be disposed on the barrier film 112. As described above, an image signal is supplied to the display region D, and any one of various display devices (not shown), such as an organic light emitting device, a liquid crystal display device, and an electrophoretic device, may be disposed in the display region D to display the image signal. In the current exemplary embodiment shown in FIG. 4, an organic light emitting device 120 is used as an example. Also, various devices, such as a thin film transistor (not shown) and a capacitor (not shown), for driving the display device may be further disposed in the display region D.

Figure 4:
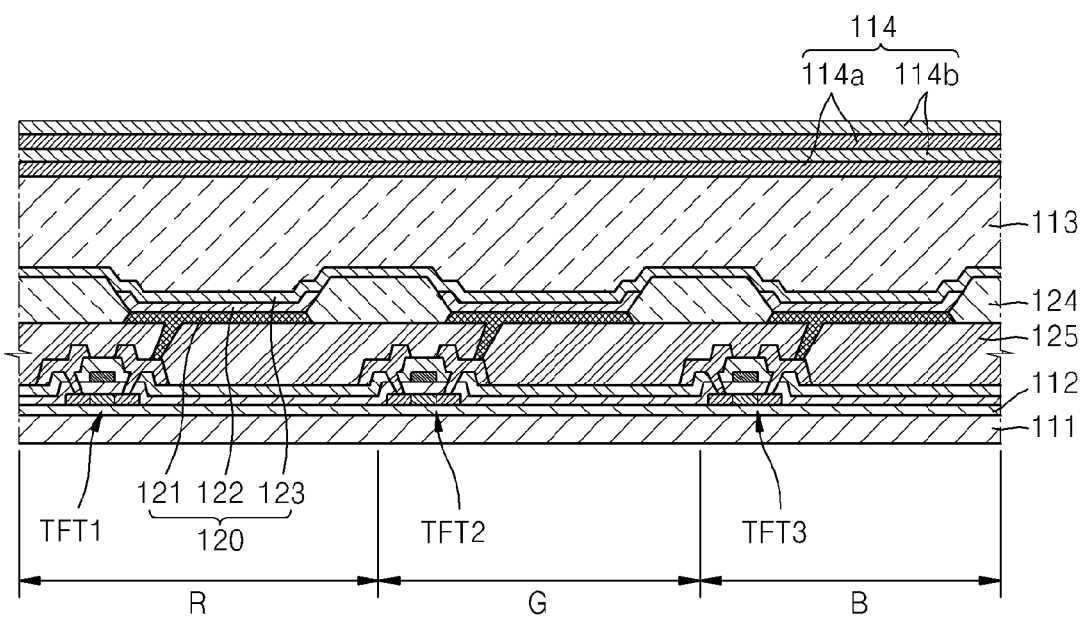
FIG. 4 is a diagram schematically illustrating a cross-section of a display region of the flexible display panel of FIG. 2.

At least one organic light emitting device 120 is disposed in the display region D, as shown in FIG. 4. The organic light emitting device 120 includes a first electrode layer 121, a second electrode layer 123 that is a common electrode layer, and an organic emission layer 122 disposed between the first electrode layer 121 and the second electrode layer 123. The first electrode layer 121 is electrically connected to thin film transistors TFT1, TFT2, and TFT3 formed on the flexible substrate 111. Although not shown in FIGS. 3 and 4, the organic light emitting device 120 emits a light from the display region D by being electrically connected to at least one switching thin film transistor and a storage capacitor.

The light emitted from the organic emission layer 122 may be emitted towards the flexible substrate 111 or towards the planarization layer 113. In the current exemplary embodiment a top emission type display device, in which an image is realized towards the planarization layer 113, is described as an example. Alternatively, a bottom emission type display device, wherein an image is realized towards the flexible substrate 111, may be used.

As described above, various circuit units (not shown) and wires (not shown) for supplying an image signal to the display device in the display region D may be disposed in the non-display region N. Although heights of the display region D and non-display region N are shown to be the same in FIG. 3, the heights may differ according to devices forming the display region D and the non-display region N.

The planarization layer 113 encapsulating at least the display region D may be disposed on the display region D and the non-display region N. The planarization layer 113 is a layer that flattens an upper surface by filling in above the upper surfaces of lower devices, and may be formed of a plurality of inorganic insulating films or have a structure including a mixture of an inorganic insulating film and an organic insulating film.

In detail, the planarization layer 113 may include at least one material selected from an epoxy-based resin, an acryl-based resin, an perylene-based resin, and a polyimide resin. Alternatively, the planarization layer 113 may include at least one material selected from among $SiO_2$, $TiO_2$, $ZrO_2$, $Ta_2O_5$, $HfO_2$, $Al_2O_3$, ZnO, $Y_2O_3$, BeO, MgO, $Pbo_2$, $WO_3$, VOX, SiNx, AlNx, ZnS, CdS, SiC, SiCN, LiF, $CaF_2$, $MgF_2$, NaF, $BaF_2$, $PbF_2$, $LaF_3$, and GaP.

The metal-dielectric layer 114 is formed on the planarization layer 113. The metal-dielectric layer 114 may have a structure in which metal layers 114a and dielectric layers 114b are alternately stacked on each other, as shown in FIG. 3. The metal layer 114a and the dielectric layer 114b each have a thickness of from several nm to dozens of nm. In FIG. 3, two metal layers 114a and two dielectric layers 114b are stacked on each other, but the numbers of the metal layers 114a and dielectric layers 114b are not limited thereto.

The metal layer 114a may include at least one metal selected from among Al, Ag, Mg, Cr, Ti, Ni, Au, Ta, Cu, Ca, Co, Fe, Mo, W, Pt, and Yb, or a combination thereof. The dielectric layer 114b may include at least one dielectric material selected from among $SiO_2$, $TiO_2$, $ZrO_2$, $Ta_2O5$, $HfO_2$, $Al_2O_3$, ZnO, $Y_2O_3$, BeO, MgO, $Pbo_2$, $WO_3$, VOX, SiNx, AlNx, ZnS, CdS, SiC, SiCN, LiF, $CaF_2$, $MgF_2$, NaF, $BaF_2$, $PbF_2$, $LaF_3$, and GaP, or a combination thereof. Alternatively, the dielectric layer 114b may include at least one material selected from the group consisting of epoxy-based resin, acryl-based resin, perylene-based resin, and polyimide resin, or an organic material having a dielectric characteristic.

In FIG. 3, the metal-dielectric layer 114 has a constant thickness because the metal layer 114a and the dielectric layer 114b are alternately stacked on each other, but alternatively, the metal layer 114a and the dielectric layer 114b may be partially formed, or another material may be added.

The anti-reflection layer 115 includes the planarization layer 113 and the metal-dielectric layer 114. The anti-reflection layer 115 may replace the thin film encapsulation layer 12 and the polarizer 13 in the conventional flexible display panel shown in FIG. 1. As described above, by removing the polarizer that has the greatest thickness, and forming the anti-reflection layer 115 operating as the thin film encapsulation layer 12 and the polarizer 13, an overall thickness of the flexible display panel 100 may be reduced.

In other words, when the anti-reflection layer 115, in which the metal layer 114a and the dielectric layer 114b are alternately stacked, is applied, the polarizer 13 may be removed, thereby increasing flexibility by reducing the thickness of the flexible display panel 100 by at least 100 um. The anti-reflection layer 115 may also have characteristics of the polarizer 13 by using the metal layer 114a and characteristics of a barrier by using the dielectric layer 114b.

The touch screen panel 116 is disposed on the anti-reflection layer 115. The touch screen panel 116 may use capacitance as a way of detecting the touch of a usert. The touch screen panel 116 includes detection patterns (not shown) and metal wires (not shown), in which capacitance changes of the detection patterns are transmitted to an integrated circuit through the metal wires. According to an exemplary embodiment, the touch screen panel 116 may not be formed on a separate substrate but may be integrally formed on the flexible substrate 111, thereby decreasing the entire thickness of the flexible display panel 100.

The window layer 117 is disposed on the touch screen panel 116. The window layer 117 may be a contact region for a finger or an object.

FIG. 4 is a diagram schematically illustrating the display region D in the cross-section of the flexible display panel 100, according to an exemplary embodiment of the present invention.

A manufacturing process of the display region D, and the anti-reflection layer 115 will now be briefly described with reference to FIG. 4.

First, the flexible substrate 111 may be formed of a flexible material described above. Then, the barrier film 112 is formed on an entire top surface of the flexible substrate 111.

The thin film transistors TFT1, TFT2, and TFT3 are formed on the barrier film 112. At least one of the thin film transistors TFT1, TFT2, and TFT3 is formed to correspond to a sub-pixel, and is electrically connected to the organic light emitting device 120.

In more detail, a semiconductor layer having a pattern is formed on the barrier film 112. The semiconductor layer may be formed of an inorganic semiconductor, such as amorphous silicon or polysilicon, or an organic semiconductor, and may include a source region, a drain region, and a channel region.

A gate insulating film formed of $SiO_2$ or $SiN_x$ is formed on the semiconductor layer, and a gate electrode is formed in a region on the gate insulating film. The gate electrode may be connected to a gate line applying an on/off signal to a thin film transistor.

An interlayer insulating film is formed on the gate electrode, and a source electrode and a drain electrode are formed to respectively contact the source and drain regions of the semiconductor layer through a contact hole. The thin film transistors TFT1, TFT2, and TFT3 may be covered and protected by a passivation film 125.

The passivation film 125 may be an inorganic insulating film and/or organic insulating film. The inorganic insulating film may include $SiO_2$, $SiN_x$, SiON, $Al_2O_3$, $TiO_2$, $Ta_2O_5$, $HfO_2$, $ZrO_2$, BST, or PZT, and the organic insulating film may include a general purpose polymer (PMMA or PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or a blend thereof. Alternatively, the passivation film 125 may have a complex stacked structure of the inorganic insulating film and the organic insulating film.

In the current exemplary embodiment, the thin film transistors TFT1, TFT2, and TFT3 may be a top gate type, but the shapes and numbers of thin film transistors are not limited and may vary.

The organic light emitting device 120 is formed on the passivation film 125. The organic light emitting device 120 includes a first electrode layer 121 and a second electrode layer 123, which face each other, and the organic emission layer 122 disposed therebetween.

In the current exemplary embodiment, the first electrode layer 121 of the flexible display panel 100 that is a top emission type may include a reflection film formed of Ag, Mg, Al, Pt, Pd, Au, Ni, Nd, Ir, Cr, or a compound thereof, and a transparent film formed of ITO, IZO, ZnO, or $In_2O_3$ that has a high work function. When the first electrode layer 121 is a passive driving type, the first electrode layer 121 may include lines having a stripe shape that are spaced apart from each other at preset intervals, but when the first electrode layer 121 is an active driving type, as in the current exemplary embodiment, the first electrode layer 121 may be patterned in the shape of each pixel. Also, the first electrode layer 121 may be connected to an external terminal (not shown) to function as an anode.

A pixel defining layer (PDL) 124 that is an insulating material may be formed on the first electrode layer 121. An opening is formed on the PDL 124, and the organic emission layer 122 of the organic light emitting device 120, to be described later, is formed in a region defined by the opening.

The second electrode layer 123 may be a transmissive electrode, and may have a semi-transmissive film formed by thinly forming a metal, such as Li, Ca, LiF/Ca, LiF/Al, Al, Mg, or Ag, having a low work function. Here, a transparent conductive film may be formed by using ITO, IZO, ZnO, or $In_2O_3$, on the metal semi-transmissive film so as to prevent high resistance caused by a thin thickness of the metal semi-transmissive film. When the second electrode layer 123 is a passive driving type, the second electrode layer 123 may have a stripe shape crossing the pattern of the first electrode layer 121, but when the second electrode layer 123 is an active driving type, as in the current exemplary embodiment, the second electrode layer 123 may be formed throughout an active region where an image is realized. Also, the second electrode layer 123 may be connected to an external terminal (not shown) to function as a cathode.

Polarities of the first electrode layer 121 and the second electrode layer 123 may be switched.

The organic emission layer 122 may be formed of either a low molecular weight organic material or a high molecular weight organic material. When the organic emission layer 122 is formed of a low molecular organic weight material, a hole transport layer (HTL) and a hole injection layer (HIL) are sequentially stacked towards the first electrode layer 121, and an electron transport layer (ETL) and an electron injection layer (EIL) are sequentially stacked towards the second electrode layer 123 based on the organic emission layer 122. Of course, another layer may be formed if required, as well as the HIL, the HTL, the ETL, and the EIL.

When the organic emission layer 122 is formed of a high molecular organic weight material, only an HTL may be disposed towards the first electrode layer 121 based on the organic emission layer 122. The HTL may be formed on the first electrode layer 121 via an inkjet printing or a spin coating method, by using poly-(2,4)-ethylene-dihydroxy thiophene (PEDOT), polyaniline (PANI), or the like.

The planarization layer 113 is then formed on an entire surface of the second electrode layer 123. As described above, the planarization layer 113 may be formed by using an organic film or an inorganic film. The planarization layer 113 may cover the organic light emitting device 120, and may have a flat upper surface.

The metal-dielectric layer 114 alternately including the metal layer 114a and the dielectric layer 114b may be formed on the planarization layer 113. In FIG. 4, the metal-dielectric layer 114 may be formed on an entire surface of the flexible substrate 111.

The touch screen panel 116 and the window layer 117 are formed on the anti-reflection layer 115 including the planarization layer 113 and the metal-dielectric layer 114, as shown in FIG. 3. The window layer 117 may be a surface contacting an outer atmosphere in the flexible display panel 100.

The flexible display panel 100 has a flexible characteristic since all or some of components of the flexible display panel 100 of FIG. 2 through FIG. 5 are formed of a flexible material.

Figure 5:
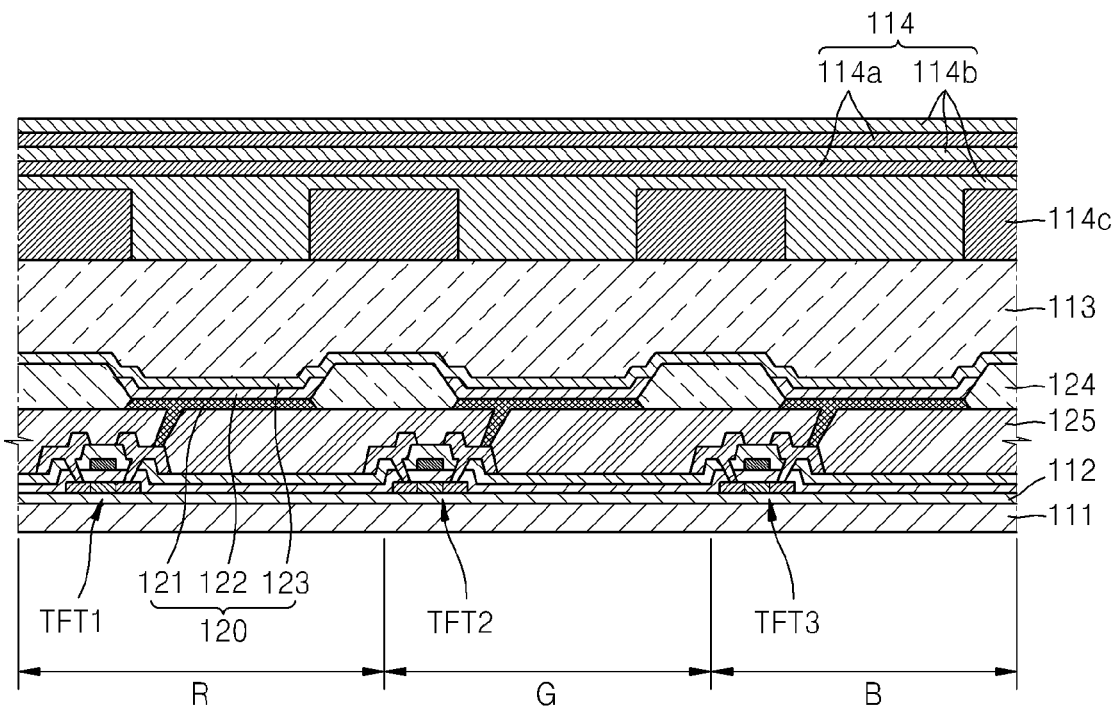
FIG. 5 is a diagram schematically illustrating a cross-section of a display region of a flexible display panel according to another exemplary embodiment of the present invention.

FIG. 5 is a diagram schematically illustrating the display region D in the cross-section of the flexible display panel 100, according to another exemplary embodiment of the present invention.

The display region D of FIG. 5 is a modified example of the display region D of FIG. 4, and thus descriptions on similar components are omitted.

In FIG. 5, a metal pattern layer 114c is formed on the planarization layer 113. The metal pattern layer 114c may be formed of the same material as the metal layer 114a. The metal pattern layer 114c may be formed by depositing a conductive material on the planarization layer 113, and then patterning the conductive material by using a mask. The metal pattern layer 114c is covered by the lowest of the dielectric layers 114b, as shown in FIG. 5. The conductive material deposited to form the metal pattern layer 114c may be thicker than the metal layer 114a and the upper two dielectric layers 114b.

The metal pattern layer 114c is patterned to correspond to a region where there is no organic emission layer 122 of each of sub-pixels R, G, and B. In other words, the metal pattern layer 114c may be formed in a region directly above the PDL 124 of each of the sub-pixels R, G, and B. In FIG. 5, visibility may be improved because the metal pattern layer 114c that is thick is formed in the region directly above the PDL 124, excluding an emission region.

Figure 6:
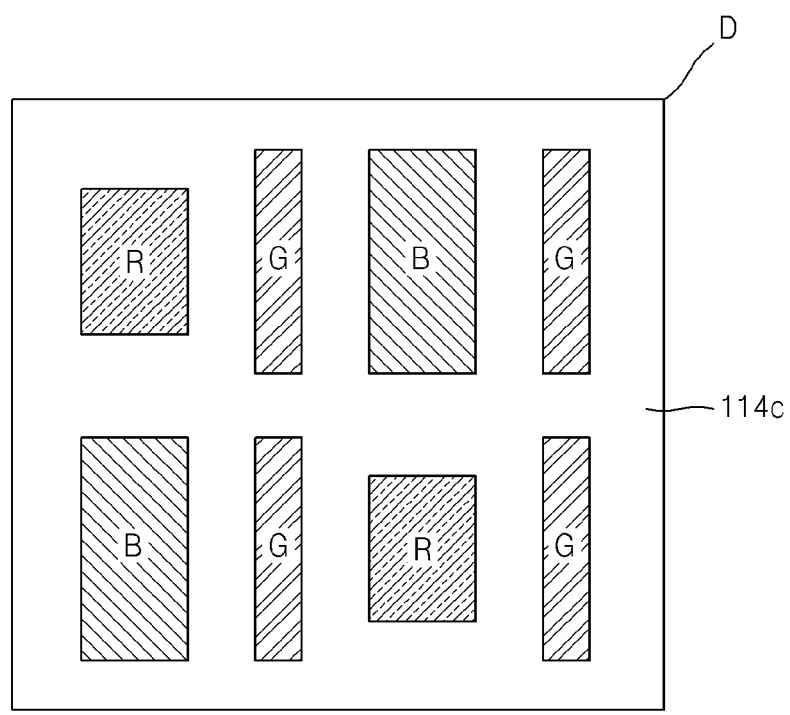
FIG. 6 is a diagram of a metal pattern layer according to an exemplary embodiment of the present invention.

FIG. 6 is a diagram of the metal pattern layer 114c according to an exemplary embodiment of the present invention.

Referring to FIG. 6, the metal pattern layer 114c is formed in a non-emission region of the sub-pixels R, G, and B, i.e., in a region directly above the PDL 124. As shown in FIG. 6, the sub-pixels R, G, and B may have different sizes according to luminance and characteristics of different colors, and the metal pattern layer 114c may be formed in the non-emission region around different emission regions. Accordingly, the metal pattern layer 114c may be patterned such that an upper region on the organic emission layer 122 is open and other regions are blocked.

In FIG. 5, the metal layers 114a and the dielectric layers 114b disposed on the metal pattern layer 114c are formed to be flat but, alternatively, the metal layer 114a and the dielectric layer 114b may be concavely deposited towards the flexible substrate 111 in a region where there is no metal pattern layer 114c according to characteristics of deposition methods.

Because the metal pattern layer 114c is relatively thick, the dielectric layer 114b contacting the metal pattern layer 114c may be formed to have a good step coverage in order to have a further improved barrier characteristic. Accordingly, the dielectric layer 114b disposed directly above the metal pattern layer 114c may be deposited by using a chemical deposition method, such as chemical deposition (CVD) or atomic layer deposition (ALD), rather than a physical deposition method, such as e-beam evaporation.

Figure 7:
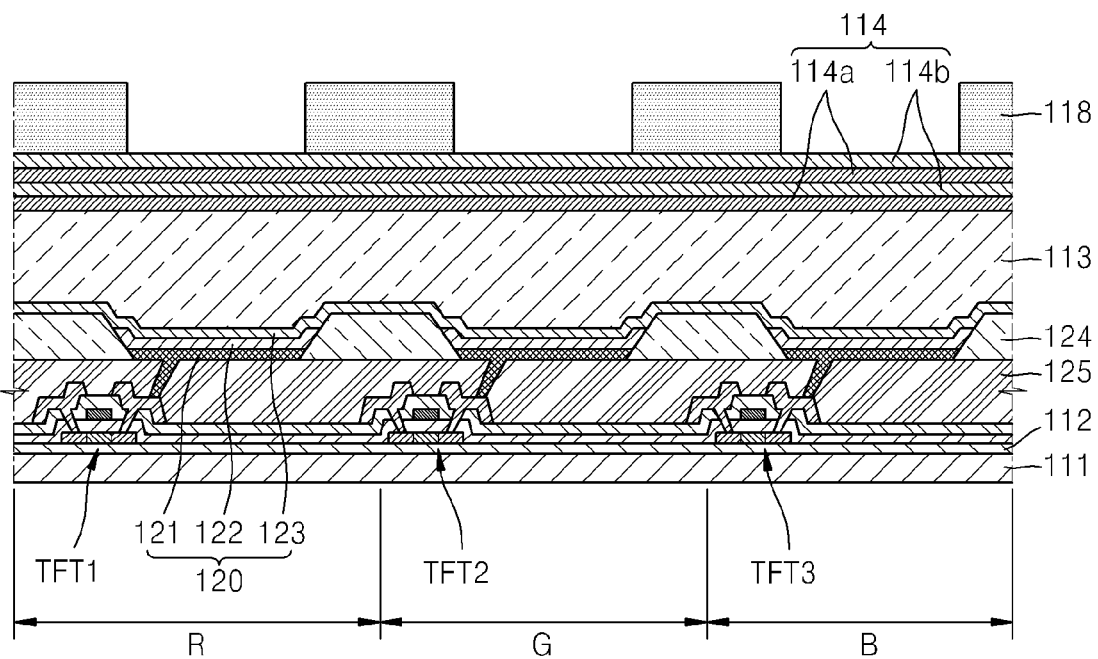
FIG. 7 is a diagram schematically illustrating a cross-section of a display region of a flexible display panel according to another exemplary embodiment of the present invention.

FIG. 7 is a diagram schematically illustrating the display region D in the cross-section of the flexible display panel 100, according to another exemplary embodiment of the present invention.

The display region D of FIG. 7 is a modified example of the display region D of FIG. 4, and thus descriptions on similar components are omitted.

In FIG. 7, a black matrix layer 118 is formed on the metal-dielectric layer 114 of the anti-reflection layer 115. The black matrix layer 118 is formed on the anti-reflection layer 115 by using a black die.

The black matrix layer 118 is formed in a region directly above the PDL 124, and may be a region where the organic emission layer 122 is not formed. In other words, the black matrix layer 118 is formed on a region of the anti-reflection layer 115 directly above a location where the metal pattern layer 114c of FIG. 5 is formed, thereby improving visibility. Accordingly, the region where the metal pattern layer 114c of FIG. 6 is formed may be omitted and replaced by the black matrix layer 118 arranged on the uppermost dielectric pattern layer 114b.

According to one or more exemplary embodiments of the present invention, a bending characteristic may be improved due to a decrease in a thickness of a flexible display panel, and visibility may be improved.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flexible display panel, comprising:
   a flexible panel comprising a display region and a non-display region, the display region comprising an organic light emitting device;
   a planarization layer disposed on the flexible panel; and
   a metal-dielectric layer disposed on the planarization layer and comprising a metal layer and a dielectric layer.

2. The flexible display panel of claim 1, wherein the metal-dielectric layer comprises a plurality of the metal layers and the dielectric layers, which are alternately stacked.

3. The flexible display panel of claim 1, wherein the metal-dielectric layer further comprises a metal pattern layer disposed directly on the planarization layer and having a thickness equal to or greater than the thicknesses of the metal layer and the dielectric layer, and
   wherein the lowest one of the plurality of dielectric layers covers the metal pattern and separates the metal pattern from the metal layer.

4. The flexible display panel of claim 3, wherein the metal pattern layer is disposed directly above a non-emission region in the display region.

5. The flexible display panel of claim 1, further comprising a black matrix layer disposed on the metal-dielectric layer.

6. The flexible display panel of claim 5, wherein the black matrix layer is disposed directly above a non-emission region in the display region.

7. The flexible display panel of claim 1, further comprising a touch screen panel and a window layer disposed on the metal-dielectric layer.

8. The flexible display panel of claim 1, wherein the planarization layer comprises at least one material selected from the group consisting of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, VOX, SiNx, AlNx, ZnS, CdS, SiC, SiCN, LiF, $CaF_2$, $MgF_2$, NaF, $BaF_2$, $PbF_2$, $LaF_3$, and GaP.

9. The flexible display panel of claim 1, wherein the planarization layer comprises at least one material selected from the group consisting of an epoxy-based resin, an acryl-based resin, a perylene-based resin, and a polyimide resin.

10. The flexible display panel of claim 1, wherein the metal layer comprises at least one material selected from the group consisting of Al, Ag, Mg, Cr, Ti, Ni, Au, Ta, Cu, Ca, Co, Fe, Mo, W, Pt, and Yb.

11. The flexible display panel of claim 1, wherein the dielectric layer comprises at least one material selected from the group consisting of $SiO_2$, $TiO_2$, $ZrO_2$, $Ta_2O5$, $HfO_2$, $Al_2O_3$, ZnO, $Y_2O_3$, BeO, MgO, $PbO_2$, $WO_3$, VOX, SiNx, AlNx, ZnS, CdS, SiC, SiCN, LiF, $CaF_2$, $MgF_2$, NaF, $BaF_2$, $PbF_2$, $LaF_3$, and GaP.

12. The flexible display panel of claim 1, wherein the dielectric layer comprises at least one material selected from the group consisting of an epoxy-based resin, an acryl-based resin, a perylene-based resin, and a polyimide resin.

13. The flexible display panel of claim 1, wherein the display region comprises:
at least one thin film transistor; and
an organic light emitting device electrically connected to the at least one thin film transistor, the organic light emitting device comprising:
a first electrode layer;
a second electrode layer facing the first electrode layer; and
an organic emission layer disposed between the first and second electrode layers.

14. A flexible display panel comprising:
a flexible panel comprising an organic light emitting device disposed on a substrate; and
an anti-reflection layer disposed on the flexible panel and having a polarization characteristic,
wherein the anti-reflection layer comprises a plurality of metal layers alternately stacked with a plurality of dielectric layers.

15. The flexible display panel of claim 14, wherein the anti-reflection layer further comprises a planarization layer.

* * * * *